United States Patent [19]

Rao

[11] Patent Number: 5,523,971

[45] Date of Patent: Jun. 4, 1996

[54] NON-VOLATILE MEMORY CELL FOR PROGRAMMABLE LOGIC DEVICE

[75] Inventor: Kameswara K. Rao, San Jose, Calif.

[73] Assignee: Xilinx, Inc., San Jose, Calif.

[21] Appl. No.: 405,490

[22] Filed: Mar. 16, 1995

[51] Int. Cl.$^6$ ................................................ G11C 7/00
[52] U.S. Cl. ........................ 365/187.07; 365/185.29; 365/154
[58] Field of Search ................................. 365/154, 156, 365/185, 185.07, 185.29

[56] References Cited

U.S. PATENT DOCUMENTS

| | | | |
|---|---|---|---|
| 4,128,773 | 12/1978 | Troutman | 365/156 |
| 4,132,904 | 1/1979 | Harari | 365/185 X |
| 4,333,166 | 6/1982 | Edwards | 365/154 X |
| 4,348,745 | 9/1982 | Schmitz | 365/154 |
| 4,467,451 | 8/1984 | Moyer | 365/185 X |

*Primary Examiner*—David C. Nelms
*Assistant Examiner*—Son Mai
*Attorney, Agent, or Firm*—Michael A. Glenn; Jeanette S. Harms

[57] ABSTRACT

The present invention provides a memory cell which includes a pair of flash EEPROM cells. One flash EEPROM cell is programmed and the other flash EEPROM cell is simultaneously erased by a single programming pulse. Because the configuration memory cell includes flash EEPROM cells, and therefore is non-volatile, a power down does not require reprogramming or refreshing of the configuration bit stored in the memory cell.

11 Claims, 3 Drawing Sheets

NON-VOLATILE MEMORY CELL FOR PROGRAMMABLE LOGIC DEVICE

BACKGROUND OF THE INVENTION

1. Technical Field

The invention relates to a programmable logic device, and in particular to a non-volatile memory cell for a programmable logic device.

2. Description of the Related Art

During the last few years, improvements in programmable logic device (PLD) architecture have permitted the manufacture of more complex devices while addressing the need for higher density and faster speeds. Despite these improvements, engineers still face certain problems and limitations with PLDs. One such problem is the volatility of the memory cells used in PLDs. Memory cells are typically used to store information regarding the configuration of a specific PLD.

FIG. 1 illustrates a conventional memory cell 100 which includes a latch 103 and an access transistor 104. Latch 103 includes two cross-coupled inverters 101 and 102. Memory cell 100 is programmed by bringing the signal on wordline WL high (i.e. a logic one) and providing the appropriate signal on bitline BL. For example, if the signal on bitline BL is low (i.e. a logic zero), then inverter 101 inverts that low signal and provides a logic one on output line OUT. Because of latch 103, the logic state of the output signal remains high until the cell 100 is reprogrammed by driving both signals on bitline BL and wordline WL to a logic high state. Alternatively, if power is lost or removed, the data stored by latch 103 is lost. Therefore, a need arises for a nonvolatile memory cell for use in PLDs that is capable of preserving data even in the event of a power loss.

SUMMARY OF THE INVENTION

In accordance with the present invention, a memory cell includes a pair of flash EEPROM cells arranged to provide a cross coupled latch which stores the logic state of the memory cell. In one embodiment, the sources of the flash EEPROM cells are connected to a power bus. The control gate of the first flash EEPROM cell is connected to a first output line, wherein the control gate of the second flash EEPROM cell is connected to a second output line. The control gate of the first flash EEPROM cell is further connected to the drain of the second flash EERPOM cell, wherein the control gate of the second flash EEPROM cell is further connected to the drain of the first flash EEPROM cell. During the programming mode of the present invention, one flash EEPROM cell is programmed, wherein the other flash EEPROM cell is simultaneously erased.

The memory cell of the present invention also includes a plurality of conventional transistors. A first transistor and a second transistor have their sources connected to a first bitline and a second bitline, respectively, and their gates connected to a wordline. The first transistor has its drain connected to the drain of the first flash EEPROM cell, whereas the second transistor has its drain connected to the drain of the second flash EEPROM cell. The first and second transistors are access transistors to the memory cell that are conducting during a programming mode and non-conducting during a read mode.

A third transistor and a fourth transistor have their drains connected to the drains of the first and second flash EEPROM cell, respectively, and their gates connected to a programming line. The third and fourth transistors are non-conducting during the programming mode and conducting during the read mode. A fifth transistor and a sixth transistor have their drains connected to the sources of the third and fourth transistors, respectively, their gates connected to the first and second output lines, respectively, and their sources connected to a voltage source. During the read mode, if the first flash EEPROM cell is erased (i.e. the second flash EEPROM cell is programmed), then the sixth transistor is conducting and the fifth transistor is non-conducting. In contrast, if the second flash EEPROM cell is erased (i.e. the first flash EEPROM cell is programmed), then the fifth transistor is conducting and the sixth transistor is non-conducting.

The memory cell in the present invention provides significant advantages over conventional memory devices. Specifically, because the memory cell includes FLASH EEPROM cells, and therefore is non-volatile, a power down does not require reprogramming or refreshing of the configuration information stored in the memory cell.

DETAILED DESCRIPTION OF THE INVENTION

Figure 2:
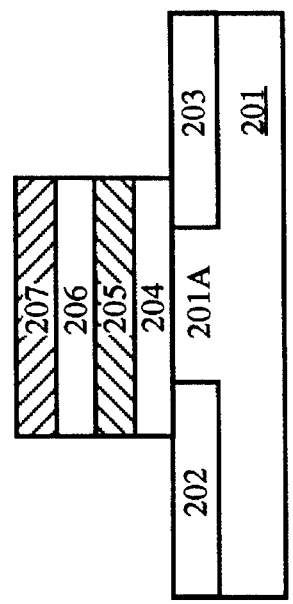
FIG. 2 shows a cross-sectional view of a flash EEPROM cell used in a configuration bit cell according to the invention.
Figure 1:
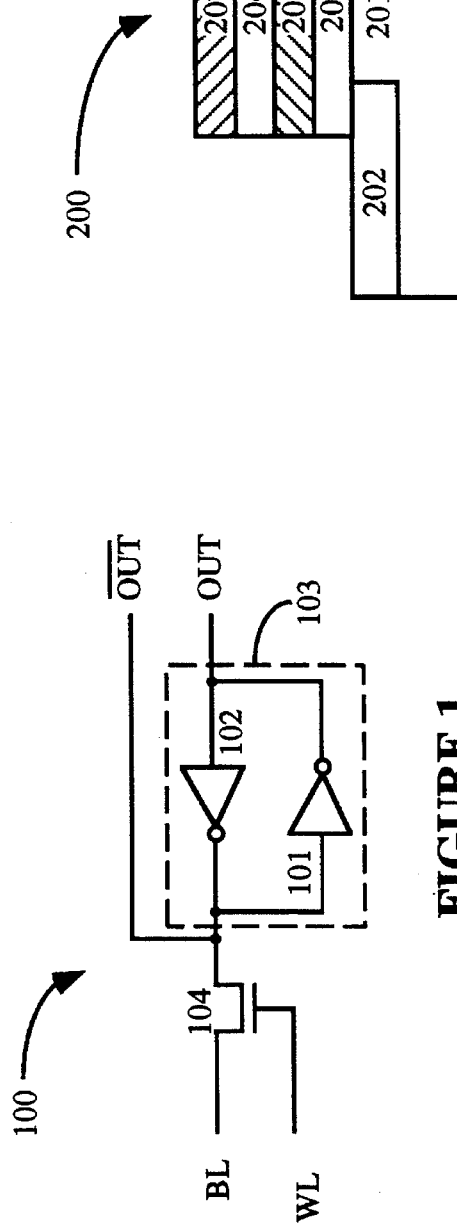
FIG. 1 illustrates a conventional volatile configuration bit cell.

FIG. 2 illustrates a cross-sectional view of a flash EEPROM cell 200 for use in a configuration bit cell according to the invention. Note that flash EEPROM cell 200 eliminates the need for the select transistor typically associated with a flash EEPROM cell. Flash EEPROM cell 200 includes a substrate 201 of, for example, a material having P-type conductivity, with a source 202 and a drain 203 of a material having N-type conductivity. Source 202 and drain 203 define the boundaries of a channel region 201A. Overlying channel region 201A is a tunnel oxide layer 204, typically having a thickness of approximately 10 nm, on which is disposed a first polysilicon layer 205. Oxide layer 206 is disposed on first polysilicon layer 205. A second polysilicon layer 207 is disposed on oxide layer 206. First polysilicon layer 205 forms the floating gate of cell 200, whereas second polysilicon layer 207 forms the control gate thereof. The materials and thicknesses of the various layers are well known in the art and therefore not described in detail herein.

Flash EEPROM cell 200 is erased/programmed by Fowler-Nordheim tunneling of electrons through tunnel oxide layer 204 between floating gate 205 and drain 203. Specifically, to erase cell 200, drain 203 is held at a high positive voltage, while control gate 207 is grounded. Electrons tunnel from floating gate 205 through tunnel oxide layer 204 to drain 203, thereby leaving floating gate 206 relatively more positively charged. In this manner, the threshold voltage of cell 200 is shifted in the negative direction. Therefore, if a high voltage is provided on control gate 207 in a READ mode, then memory cell 200 is turned on, i.e conducts. This erased state, by convention, corresponds to a logic zero.

To program flash EEPROM cell 200, a high voltage is provided on control gate 207 while drain 203 is grounded. In this manner, electrons tunnel back from drain 203 to floating gate 205, thereby leaving floating gate 206 relatively more negatively charged. In this manner, the threshold voltage of cell 200 is shifted in the positive direction. Therefore, if a high voltage is provided on control gate 207 in a READ mode, then memory cell 200 remains turned off, i.e remains non-conducting. This programmed state, by convention, corresponds to a logic one. Because both the programming and erase steps discussed above are performed by means of Fowler-Nordheim tunneling, thereby necessitating high voltages, an on-chip charge pump circuit is used in one embodiment.

Figure 3:
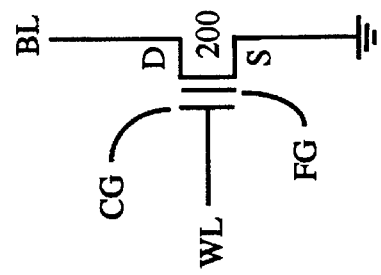
FIG. 3 is a schematic view of the flash EEPROM cell of FIG. 2.

FIG. 3 is a schematic view of flash EEPROM cell 200 of FIG. 2. In this embodiment of the invention, a bitline BL is connected to drain D (drain 203 in FIG. 2), source S (source 202 of FIG. 2) is grounded, and a wordline WL is connected to control gate CG (control gate 207 in FIG. 2).

Figure 4:
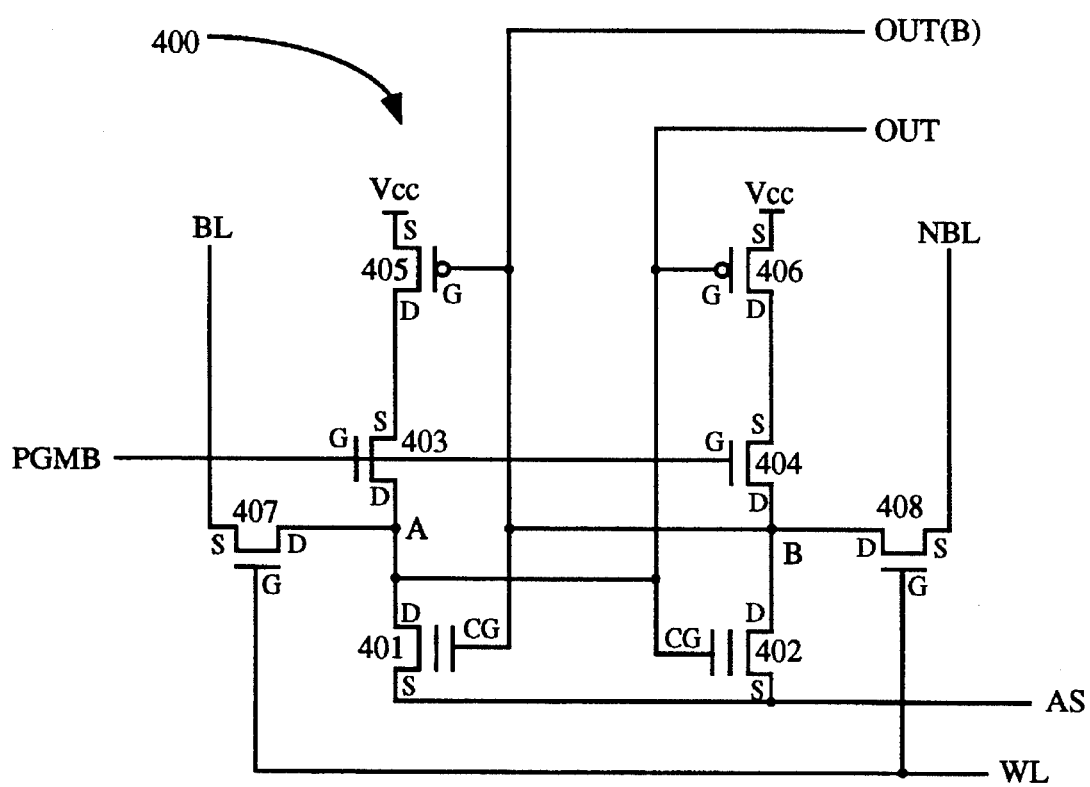
FIG. 4 is a schematic diagram of a nonvolatile configuration memory cell according to the invention.

FIG. 4 illustrates a non-volatile memory cell 400 according to the present invention which includes two flash EEPROM cells 401 and 402. Each flash EEPROM cell has an identical configuration to that of flash EEPROM cell 200 (FIGS. 2 and 3). Flash EEPROM cells 401 and 402 are arranged to provide a cross coupled latch which stores the logic state of memory cell 400. Specifically, the sources S of flash EEPROM cells 401 and 402 are connected to a power bus AS. The control gate CG of cell 401 is connected to an output line OUT(B), wherein the control gate CG of flash EEPROM cell 402 is connected to another output line OUT. The control gate CG of cell 401 is further connected to the drain D of cell 402, wherein the control gate CG of cell 402 is further connected to the drain D of cell 401.

Configuration memory cell 400 also includes a plurality of conventional transistors 403, 404, 405, 406, 407, and 408. Specifically, an NMOS transistor (hereinafter access transistor) 407 has its source S connected to a bitline BL, its gate G connected to a wordline WL, and its drain D connected to the drain D of cell 401. Similarly, an NMOS transistor (hereinafter access transistor) 408 has its source S connected to bitline BL, its gate G connected to wordline WL, and its drain D connected to the drain D of cell 402.

An NMOS transistor 403 has its drain D connected to the drain D of flash EEPROM cell 401, and its source S connected to the drain D of a PMOS transistor 405. Similarly, an NMOS transistor 404 has its drain D connected to the drain D of flash EEPROM cell 402, and its source S connected to the drain D of a PMOS transistor 406. Both transistors 403 and 404 have their gates G connected to a programming line PGMB, whereas both transistors 405 and 406 have their sources S connected to a voltage source Vcc and their gates G connected to the control gates CG of flash EEPROM cells 401 and 402, respectively.

In accordance with the programming mode of the present invention, one flash EEPROM cell, for example flash EEPROM cell 402, is programmed, wherein the other flash EEPROM cell, in this example flash EEPROM cell 401, is simultaneously erased. To provide this configuration, a low voltage or zero volts is provided on programming line PGMB, a high voltage of approximately 15 volts is provided on wordline WL, a high voltage of approximately 13 volts is provided on bitline BL, a low voltage or zero volts is provided on bitline complement NBL, and line AS is left floating. These voltages turn off transistors 403 and 404, and turn on access transistors 407 and 408. In this configuration, a potential of about 13 volts is provided on the drain D of flash EEPROM cell 401 and the control gate CG of flash EEPROM cell 402, whereas a potential of zero volts is provided on the drain D of flash EEPROM cell 402 and the control gate CG of flash EEPROM cell 401, thereby erasing flash EEPROM cell 401 and programming flash EEPROM cell 402. To program flash EEPROM cell 401 and erase flash EEPROM cell 402, the steps detailed above are followed with the exception that a low voltage or zero volts is provided on bitline BL and a high voltage of approximately 13 volts is provided on bitline complement NBL In a READ mode, a logic one signal is provided on programming line PGMB and a logic zero signal is provided on line AS. Assuming the signals on output lines OUT and OUTB start at zero volts, transistors 405 and 406 turn on, thereby pulling up the voltage on nodes A and B towards Vcc. However, because device 401 is in a conducting state, node A is pulled down to zero volts, thereby ensuring that transistor 406 remains conducting. Conducting transistor 406 in turn transfers a high voltage to node B as well as to the control gate CG of flash EEPROM cell 401. This high voltage turns off transistor 405 and turns on erased flash EEPROM 401. EEPROM 401, in its conducting state, transfers the low voltage on line AS to node A, thereby completing the latch configuration. Note flash EEPROM cell 402, in its programmed state, remains off irrespective of the signal on node A. Thus, if flash EEPROM cell 402 is programmed (i.e. non-conducting) and flash EEPROM cell 401 is erased (i.e. conducting), then the signal on the output line OUT is held high (i.e. a logic one), whereas the signal on output line OUTB is held low (i.e. a logic zero). In one embodiment, this configuration is referred to as State 1.

On the other hand, if flash EEPROM cell 402 is erased (i.e. conducting) and flash EEPROM cell 401 is programmed (i.e. non-conducting), then the signal on output line OUT is held low (i.e. a logic zero), whereas the signal on output line OUTB is held high (i.e. a logic one). This state is referred to as State 2.

Figure 5:
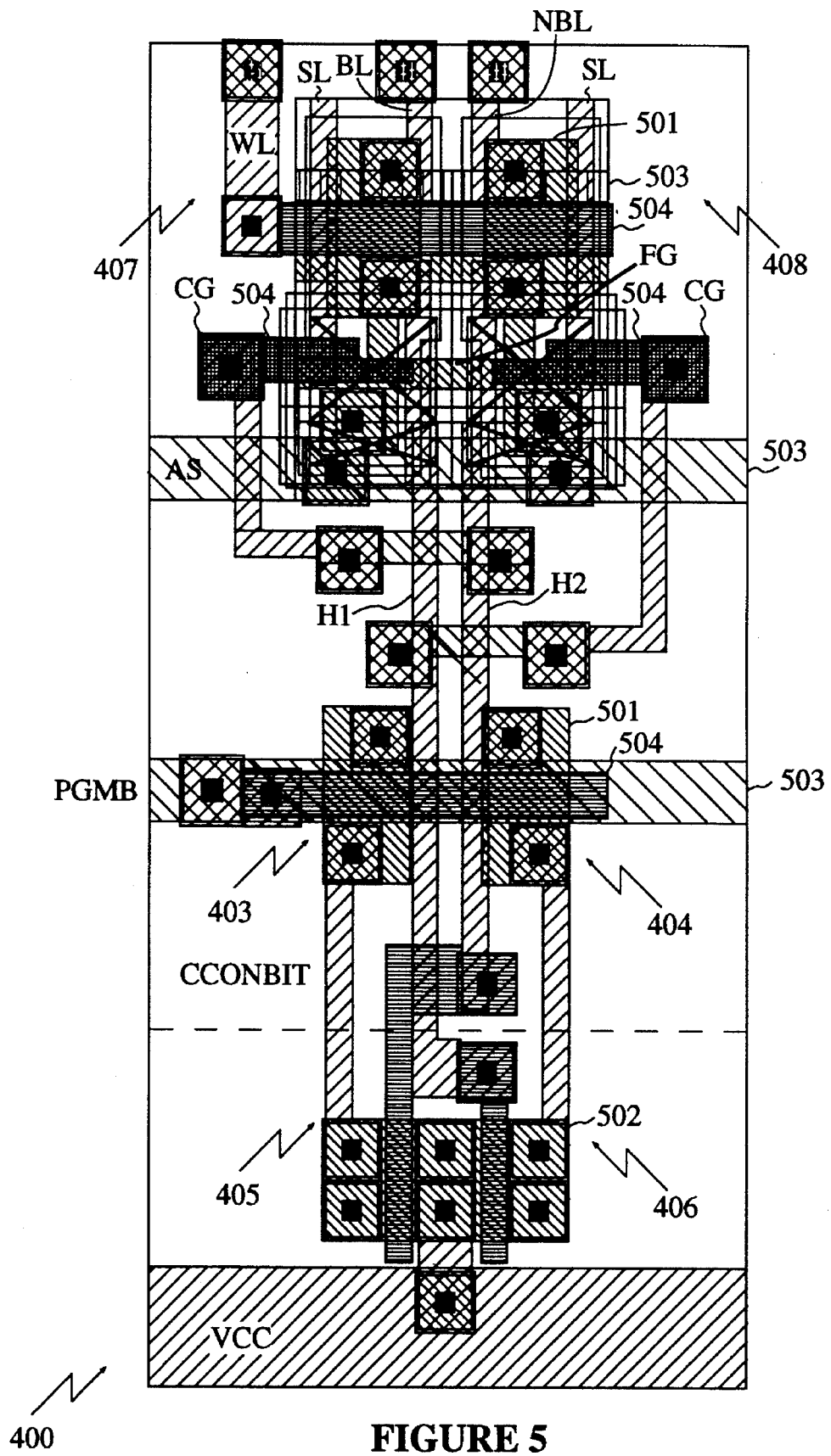
FIG. 5 is a layout of one embodiment of a memory cell in accordance with the present invention.

FIG. 5 is one embodiment of a layout for memory cell 400 in accordance with the present invention. Regions 501 indicate an n-diffusion area, regions 502 a p-diffusion area, regions 503 a first polysilicon layer, and regions 504 a second polysilicon layer. Other reference numerals correspond to those used in FIGS. 3 and 4. Note that all steps to fabricate memory cell 400 are conventional, and therefore not described in detail herein.

The memory cell in the present invention provides significant advantages over conventional memory devices. Specifically, because the memory cell includes flash EEPROM cells, and therefore is non-volatile, a power down does not require reprogramming or refreshing of the configuration information stored in the memory cell.

Although the invention is described herein with reference to a specific embodiment, those skilled in the art will readily appreciate that embodiments other than the one set forth herein will not depart from the spirit and scope of the present invention. For example, although the logic state of each memory cell may be loaded independently, other embodiments of the present invention load a plurality of memory cells in a single programming cycle. Accordingly, the invention should only be limited by the claims included below.

I claim:

1. A memory cell comprising:

a first non-volatile programmable and erasable storage cell;

a second non-volatile programmable and erasable storage cell, wherein each storage cell includes a first terminal, a second terminal, and a control terminal, wherein the first terminals of said first and second storage cells are connected to a power bus, wherein the second terminal of said first storage cell is selectively connected to a first bitline and the second terminal of said second storage cell is selectively connected to a second bitline, wherein the control terminal of said first storage cell is connected to the second terminal of said second storage cell and a first output line, and wherein the control terminal of said second storage cell is connected to the second terminal of said first storage cell and a second output line; and means for forming a latch including said first and second storage cells, wherein said means for forming is operatively coupled to said first and second output lines.

2. The memory cell of claim 1 wherein said first storage cell includes a first flash EEPROM cell.

3. The memory cell of claim 2 wherein said second storage cell includes a second flash EEPROM cell.

4. The memory cell of claim 3 wherein the first terminals of said first and second flash EEPROM cells are sources.

5. The memory cell of claim 1 further including a first transistor having a drain, a source, and a gate, and a second transistor having a drain, a source, and a gate, wherein the sources of said first and second transistors are connected to said first and second bitlines, respectively, and the drains of said first and second transistors are connected to the second terminals of said first and second storage cells, respectively.

6. The memory cell of claim 5 wherein the gates of said first and second transistors are connected to a wordline.

7. The memory cell of claim 6 wherein said means for forming includes a third transistor having a drain, a source, and a gate, and a fourth transistor having a drain, a source, and a gate, wherein the drains of said third and fourth transistors are connected to the second terminals of said first and second storage cells, respectively, and the gates of said third and fourth transistors are connected to a programming line.

8. The memory cell of claim 7 wherein said means for forming further includes a fifth transistor having a drain, a source, and a gate, and a sixth transistor having a drain, a source, and a gate, wherein the drains of said fifth and sixth transistors are connected to the sources of said third and fourth transistors, respectively.

9. The memory cell of claim 8 wherein the gates of said fifth and sixth transistors are connected to said first and second output lines, respectively.

10. The memory cell of claim 9 wherein the sources of said fifth and sixth transistors are connected to a voltage source.

11. A method of providing a non-volatile memory cell including:

providing a first non-volatile programmable and erasable storage cell, and a second non-volatile programmable and erasable storage cell;

cross-coupling said first and second storage cells such that if said first storage cell is programmed, then said second storage cell is erased;

providing a means to selectively program said first and second storage cells via a first bit line and a second bit line, respectively; and forming a latch including said first and second storage cells, a first transistor, and a second transistor, wherein the control terminals of said first storage cell and said first transistor are connected to a first output line, and wherein the control terminal of said second storage cell and said second transistor are connected to a second output line.

\* \* \* \* \*